(12) United States Patent
Regan et al.

(10) Patent No.: US 7,863,798 B2
(45) Date of Patent: Jan. 4, 2011

(54) NANOCRYSTAL POWERED NANOMOTOR

(75) Inventors: Brian C. Regan, Los Angeles, CA (US); Alexander K. Zettl, Kensington, CA (US); Shaul Aloni, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 671 days.

(21) Appl. No.: 11/229,935

(22) Filed: Sep. 19, 2005

(65) Prior Publication Data
US 2008/0197339 A1     Aug. 21, 2008

Related U.S. Application Data

(63) Continuation-in-part of application No. 11/085,397, filed on Mar. 21, 2005, now Pat. No. 7,341,651.

(60) Provisional application No. 60/615,782, filed on Oct. 4, 2004.

(51) Int. Cl.
*H02N 11/00* (2006.01)
*H02N 1/04* (2006.01)

(52) U.S. Cl. .................. 310/300; 310/309; 977/725; 977/733; 977/752; 359/224; 359/290

(58) Field of Classification Search .......... 977/725, 977/733, 752; 310/300, 309; 359/224, 290
See application file for complete search history.

(56) References Cited

U.S. PATENT DOCUMENTS

| | | | |
|---|---|---|---|
| 5,620,857 A | 4/1997 | Weetall et al. | |
| 5,641,466 A | 6/1997 | Ebbesen et al. | |
| 6,628,053 B1 | 9/2003 | Den et al. | |
| 6,773,616 B1 * | 8/2004 | Chen et al. | 216/41 |
| 6,936,811 B2 | 8/2005 | Kibar | |
| 6,982,174 B2 * | 1/2006 | Bonnell et al. | 438/3 |
| 7,014,823 B2 * | 3/2006 | Chase et al. | 422/211 |

(Continued)

OTHER PUBLICATIONS

Bertrand et al, Carbon Nanotube Based Bearing for Rotational Motions, Mar. 9, 2004, Nano Letters, vol. 4 No. 4, pp. 709-712.*

(Continued)

*Primary Examiner*—G. Nagesh Rao
(74) *Attorney, Agent, or Firm*—Robin C. Chiang; Lawrence Berkeley National Laboratory

(57) ABSTRACT

A nanoscale nanocrystal which may be used as a reciprocating motor is provided, comprising a substrate having an energy differential across it, e.g. an electrical connection to a voltage source at a proximal end; an atom reservoir on the substrate distal to the electrical connection; a nanoparticle ram on the substrate distal to the atom reservoir; a nanolever contacting the nanoparticle ram and having an electrical connection to a voltage source, whereby a voltage applied between the electrical connections on the substrate and the nanolever causes movement of atoms between the reservoir and the ram. Movement of the ram causes movement of the nanolever relative to the substrate. The substrate and nanolever preferably comprise multiwalled carbon nanotubes (MWNTs) and the atom reservoir and nanoparticle ram are preferably metal (e.g. indium) deposited as small particles on the MWNTs. The substrate may comprise a silicon chip that has been fabricated to provide the necessary electrodes and other electromechanical structures, and further supports an atomic track, which may comprise an MWNT.

11 Claims, 4 Drawing Sheets

U.S. PATENT DOCUMENTS

| | | | | |
|---|---|---|---|---|
| 7,053,520 | B2* | 5/2006 | Zetti et al. | 310/309 |
| 7,077,939 | B1* | 7/2006 | Crooks et al. | 204/450 |
| 2002/0004136 | A1* | 1/2002 | Gao et al. | 428/367 |
| 2002/0179434 | A1* | 12/2002 | Dai et al. | 204/242 |
| 2003/0068432 | A1* | 4/2003 | Dai et al. | 427/58 |
| 2003/0190278 | A1* | 10/2003 | Wang et al. | 423/447.3 |
| 2004/0004212 | A1* | 1/2004 | Crespi et al. | 257/14 |
| 2004/0110003 | A1* | 6/2004 | Cumings et al. | 428/399 |
| 2004/0157304 | A1* | 8/2004 | Guo | 435/183 |
| 2004/0203071 | A1* | 10/2004 | Chase et al. | 435/7.1 |
| 2004/0239210 | A1* | 12/2004 | Pinkerton et al. | 310/309 |
| 2005/0017598 | A1* | 1/2005 | Zettl et al. | 310/309 |
| 2005/0126913 | A1* | 6/2005 | Burke et al. | 204/547 |
| 2005/0266416 | A1* | 12/2005 | Guo | 435/6 |
| 2007/0114880 | A1* | 5/2007 | Zettl et al. | 310/309 |

OTHER PUBLICATIONS

Regan et al, Nanocrystal-Powered Nanomotor, Aug. 11, 2005, Nano Letters, vol. 5 No. 9, pp. 1730-1733.*
Fennimore et al, Rotational Actuators Based on Carbon Nanotubes, Jul. 24, 2003, Nature, vol. 424, pp. 408-410.*
Joachim et al, Single Molecular Rotor at the Nanoscale, 2001, Springer-Verlag Berlin Heidelberg, Structure & Bonding vol. 99, pp. 1-18.*
Sanders, Robert, Physicists Build World's Smallest Motor Using Nanotubes and Etched Silicon, Jul. 23, 2003, UC Berkeley News pp. 1-5.*
Falvo et al., "Nanometre-scale rolling and sliding of carbon nanotubes", Nature, vol. 397, pp. 236-238, (Jan. 21, 1999).
Minett et al., "Nanotube actuators for nanomechanics", Current Applied Physics, vol. 2, pp. 61-64, (2002).
Fraysse et al., "Carbon nanotubes acting like actuators", Carbon, vol. 40, pp. 1735-1739, (2002).
Ciuparu et al., "Synthesis of Pure Boron Single-Wall Nanotubes", The Journal of Physical Chemistry, vol. 108, No. 13, pp. 3967-3969, (Mar. 10, 2004).
Fan et al., "Fabrication of Silica Nanotube Arrays from Vertical Silicon Nanowire Templates", Journal of the American Chemical Society, vol. 125, No. 18, pp. 5254-5255, (Apr. 9, 2003).
Schrader et al., "Neutral Atom Quantum Register", Physical Review Letters, vol. 93, No. 15, pp. 150501-1-150501-4, (Oct. 6, 2004).
Kang et al., "Atomic-scale simulations of copper polyhedral nanorods", Nanotechnology, vol. 13, pp. 524-532, (Jul. 26, 2001).
Zhu et al., "Deformation and Fracture of a SiO2 Nanorod", Molecular Simulation, vol. 29, No. 10 & 11, pp. 671-676, (Oct.-Nov. 2003).
Endo et al., "The Production and Structure of Pyrolytic Carbon Nanotubes (PCNTs)", Journal of Physical Chemical Solids, vol. 54, No. 12, pp. 1841-1848, (1993).
Terrones et al., "Controlled production of aligned-nanotube bundles", vol. 388, pp. 52-55,(Jul. 1997).
Kyotani et al., "Preparation of Ultrafine Carbon Tubes in Nanochannels of an Anodic Aluminum Oxide Film", Chemistry of Materials, vol. 8, No. 8, pp. 2109-2113, (1996).
Ge et al., "Evidence of Spinodal Phase Separation in Two-Dimensional Nanocrystal Self-Assembly," The Journal of Physical Chemistry B., vol. 104, No. 41, pp. 9573-9575, (Oct. 19, 2000).
Kulkarni et al., "Mesoscale organization of metal nanocrystals*", Pure and Applied Chemistry, vol. 74, No. 9, pp. 1581-1591, (2002).
Brott et al., "Ultrafast holographic nanopatterning of biocatalytically formed sillica", Nature, vol. 413, pp. 291-293, (Sep. 20, 2001).
Aizenberg et al., "Control of crystal nucleation by patterned self-assembled monolayers", Nature, vol. 398, pp. 495-498, (Apr. 8, 1999).
Aizenberg, "Patterned crystallization of calcite in vivo and in vitro", Journal of Crystal Growth, vol. 211, pp. 143-148, (2000).

Whaley et al., "Selection of peptides with semiconductor binding specificity for directed nanocrystal assembly", Nature, vol. 405, pp. 665-668, (Jun. 8, 2000).
Weiner et al., "Lamellar Bone: Structure-Function Relations", Journal of Structural Biology, vol. 126, pp. 241-255, (1999).
Li et al., "Self-Similar Chain of Metal Nanospheres as an Efficient Nanolens", Physical Review Letters, vol. 91, No. 22, pp. 227402-1-227402-4, (Nov. 26, 2003).
Fuhrer et al., "Crossed Nanotube Junctions", Science, vol. 288, pp. 494-497 (Apr. 21, 2000).
Hisamoto et al., "FinFET—A Self-Aligned Double-Gate MOSFET Scalable to 20 nm", IEEE Transactions on Electron Devices, vol. 47, No. 12, pp. 2320-2325, (Dec. 2000).
Judy, "Microelectromechanical systems (MEMS): fabrication, design and applications", Smart Materials and Structures, vol. 10, pp. 1115-1134, (Nov. 26, 2001).
Howard, "Molecular motors: structural adaptations to cellular functions", Nature, vol. 389, pp. 561-567, (Oct. 9, 1997).
Vale et al., "The Way Things Move: Looking Under the Hood of Molecular Motor Proteins", Science, vol. 288, pp. 88-95, (Apr. 7, 2000).
Visscher et al., "Single kinesin molecules studied with a molecular force clamp", Nature, vol. 400, pp. 184-189, (Jul. 8, 1999).
Vale, "Myosin V motor proteins: marching stepwise towards a mechanism", The Journal of Cell Biology, vol. 163, No. 3, pp. 445-450, (Nov. 10, 2003).
Karki et al., "Cytoplasmic dynein and dynactin in cell division and intracellular transport", Current Opinion in Cell Biology, vol. 11, pp. 45-53, (1999).
Regan et al., "Carbon nanotubes as nanoscale mass conveyors", Nature, vol. 428, pp. 924-927, (Apr. 29, 2004).
Taber, "Frost Heaving", Journal of Geology, vol. 37, pp. 428-461, (1929).
Rempel et al.,"Premelting dynamics in a continuum model of frost heave", Journal of Fluid Mechanics, vol. 498, pp. 227-244, (2004).
Ozawa, "Thermodynamics of frost heaving: A thermodynamic proposition for dynamic phenomena", Physical Review E, vol. 56, No. 3, pp. 2811-2816, (Sep. 1997).
Derjaguin et al., "The Theory of Frost Heaving," Journal of Colloid and Interface Science, vol. 67, No. 3, pp. 391-396, (Dec. 1978).
Pavlovska et al., "Orientation dependence of the quasi-liquid layer on tin and indium crystals", Surface Science, vol. 314, pp. 341-352, (1994).
Dash, "Thermomolecular Pressure in Surface Melting: Motivation for Frost Heave", Science, vol. 246, pp. 1591-1593, (Dec. 22, 1989).
Wilen et al., "Dispersion-force effects in interfacial premelting of ice", Physical Review B, vol. 52, No. 16, pp. 12426-12433, (Oct. 15, 1995).
Wilen et al., "Frost Heave Dynamics at a Single Crystal Interface", Physical Review Letters, vol. 74, No. 25, pp. 5076-5079, (Jun. 19, 1995).
Ruoff et al., "Mechanical and Thermal Properties of Carbon Nanotubes," vol. 33, No. 7, pp. 925-930, (Feb. 10, 1995).
Poncharal et al., "Electrostatic Deflections and Electromechanical Resonances of Carbon Nanotubes", Science, vol. 283, pp. 1513-1516, (Mar. 5, 1999).
Soong et al., "Powering an Inorganic Nanodevice with a Biomolecular Motor", Science, vol. 290, pp. 1555-1558, (Nov. 24, 2000).
Limberis et al., "Toward kinesin-powered microdevices", Nanotechnology, vol. 11, pp. 47-51, (2000).
Habeebullah et al., "Prototype device for converting freezing energy into mechanical works", Energy Conversion and Management, vol. 44, pp. 251-265, (2003).

* cited by examiner

NANOCRYSTAL POWERED NANOMOTOR

CROSS-REFERENCE TO RELATED APPLICATIONS

This Patent Application is a CIP and claims benefit to patent application Ser. No. 11/085,397, filed Mar. 21, 2005, now U.S. Pat. No. 7,341,651 entitled "Nanoscale Mass Conveyors," and claims benefit to Provisional Patent Application Ser. 60/615,782, filed Oct. 4, 2004, entitled "Nanocrystal Powered Nanomotor", both of which are hereby incorporated by reference.

STATEMENT OF GOVERNMENTAL SUPPORT

This invention was made during work supported by U.S. Department of Energy under Contract No. DE-AC02-05CH11231 and by the National Science Foundation under Grant No. CCR 0210176. The government has certain rights in this invention.

REFERENCE TO SEQUENCE LISTING OR COMPACT DISK

NONE

BACKGROUND OF THE INVENTION

1. Field of the Invention

The present invention relates to the field of carbon nanotubes and to the field of molecular sized electromechanical devices which contain nanoscale levers, such as carbon nanotubes and the like.

2. Related Art

The industrial revolution was driven by the development of efficient linear-motor-based steam engines capable of operating machinery and relieving human and animal physical labor. Even today, many mechanical systems are powered by linear motors (such as the internal combustion engine and hydraulic and pneumatic rams), using gas or liquid working fluids in piston/cylinder/control valve arrangements not unlike those of the original steam engines. Recent progress in the extreme miniaturization of electronic (Refs. 1, 2) and mechanical (Ref. 3) systems raises the question: can similar linear motors be fabricated and operated at the molecular or nanoscale?

The direct scaling of many proven macroscopic motor designs to nanometer length scales appears challenging. Vapor phase engines, for instance, become sensitive to single-particle effects—at room temperature one molecule in a piston volume of 10 $nm^3$ already exerts a pressure of more than 4 atmospheres. Molecular-scale linear motors (Refs. 4, 5), such as kinesin (Ref. 6), myosin (Ref. 7), and dynein (Ref. 8), already exist in nature. However, such structurally complex biomotors have limited force capability and require tightly controlled chemical environments for operation (Ref 9), features which restrict their applications potential and make them questionable models for synthetic analogues.

Thus there is a need for an efficient nanoscale size motor that can be assembled efficiently and driven by electrical, magnetic, optical or similar energy which can operate on single or small clusters of atoms.

Den et al. U.S. Pat. No. 6,628,053 discloses a carbon nanotube device comprising a support having a conductive surface and a carbon nanotube, wherein one terminus of the nanotube binds to the conductive surface so that conduction between the surface and the carbon nanotube is maintained. The device is used as an electron generator.

Falvo et al. Nature 397:236-238 (Jan. 21, 1997) disclose studies involving the rolling of carbon nanotubes using atomic force microscope (AFM) manipulation of multiwall carbon nanotubes (MWCNT, termed in the paper "CNT").

Minett et al. Current Applied Physics 2:61-64 (2002) disclose the use of carbon nanotubes as actuators in which the driving force is obtained from a deformation of the nanotube when a charge is applied. The authors, in their review also disclose the growth of nanotubes across two metal contacts in a process that involved E-beam lithography and selective patterning.

Fraysse at al. Carbon 40:1735-1739 (2002) discloses carbon nanotubes that act like actuators. In concept, a SWNT may be disposed above a substrate and between a pair of metal-on-oxide layers. The nanotubes act as actuators though a cantilever effect achieved through longitudinal deformation of the nanotube.

BRIEF SUMMARY OF THE INVENTION

The present invention comprises a nanoscale motor, comprising a source of a radiant energy differential across a substrate from a first end to a second end. The radiant energy is illustrated as the creation of an electrical field by electrodes of opposite voltage. The radiant energy may be conducted by the substrate. Other energy sources may be used, however. The device of the invention further comprises an atom reservoir on the substrate towards the first end. The atom reservoir provides a source of individual or small groups of atoms to be moved by the energy gradient created in a direction running from the first end to the second end. The device further comprises a nanoparticle ram on the substrate towards the second end for receiving atoms from the atom reservoir. The term "ram" is used in that, in one preferred embodiment, the particle acts as a mechanical ram. The device further comprises a nanolever contacting the nanoparticle ram, whereby the radiant energy differential between the nanoparticle ram and the atom reservoir causes change of nanoparticle ram size and movement of the nanolever.

The present invention in its presently configured embodiment comprises a nanoscale reciprocating motor having: a substrate for supporting motor components and having an electrical connection at a proximal end; an atom reservoir comprising electrically separable atoms on the substrate distal to the electrical connection; a nanolever contacting a nanoparticle ram and having an electrical connection to a voltage source, whereby a voltage applied between the electrical connections to the substrate and the nanolever causes change of nanoparticle ram size and movement of the nanolever in response to the nanoparticle change. Inorganic nanotubes or nanowires may also be employed. For example, Ciuparu and colleagues describe the synthesis of pure, single-walled boron nanotubes (J. Phys. Chem. B 2004, 108, 3967). See, also: Fan, R., Wu, Y., Li, D., Yue, M., Majumdar, A. & Yang P. "Fabrication of silica nanotube arrays from vertical silicon nanowire templates," J. Am. Chem. Soc. 125, 5254-5255 (2003).

The present device is constructed so that an electrical field is created between the atom reservoir and the nanoparticle ram. Electrical connections may be on the substrate or the substrate and the ram. In one aspect of the present invention, the substrate and the nanolever are multiwalled carbon nanotubes (MWNTs). Additionally, the nanoparticle ram comprises a metal, or other chargeable material that causes a nanoparticle to shrink or grow in response to an electrical current. The nanoparticle ram exchanges nanoparticles, as it shrinks and grows, with an atom reservoir, which is disposed on the substrate and also exposed to the voltage source. Accordingly, the device may further comprise a voltage source for delivering reversible positive and negative voltages to the nanolever and substrate.

The present device may be constructed with out electrical connections if structure is supplied for delivering electrical, magnetic or optical energy along a path between the atom reservoir and the ram. In one embodiment, the energy for atomic movement is supplied by one or more lasers which act on atoms as provided by the atomic reservoir and scans along the substrate to move the atoms to the ram. Laser beams are used to chill atoms and trap them in space. This technique has been demonstrated by the 1997 Nobel prize-winning work of Steven Chu, William D. Phillips and Claude Cohen-Tannoudji.

When an atom is illuminated by counter-propagating light and absorbs a photon, its momentum changes the atomic velocity. After many cycles of absorption and emission, the velocity of the atom becomes nearly zero. In each cycle the atom loses energy which corresponds to the Doppler shift. The kinetic energy of the atom can eventually be lower than one microKelvin. This atom can then be trapped by two opposing laser beams that have frequencies lower than the atom's absorption maximum. As the atom moves in the direction of one of the laser beams it sees a frequency increase (Doppler effect). The frequency increase moves into the atom's absorption band causing a momentum kick in the opposite direction. The atom is then fixed in space by the two beams. Cooling allows the atom to be held longer since its random thermal motions are minimized.

In another configuration, U.S. Pat. No. 6,936,811 to Kibar, issued Aug. 30, 2005, entitled "Method for separating microparticles," and incorporated by reference herein describes a method for separating particles which comprises the steps of: applying a light source to create a light intensity pattern, exposing particles to the light intensity pattern producing force on each particle and moving the light intensity pattern with respect to the particles causing the particles to move with the light intensity pattern at velocities related to their respective physical properties. If the particles have different physical properties they will move at a different velocity causing the particles to separate. Further description of optical manipulation of atoms is found in Schrader et al. "A neutral atom quantum register," Physical Review Letters 93, 150501 (2004).

Laser cooling applications demand single-frequency operation in the visible (red) and IR wavelength region. Sodium, rubidium and cesium are the most common atoms used in cooling experiments, and Coherent's 899-21 Actively Stabilized, Single-Frequency Ring Laser (or MBR-110 Monolithic Block Resonator) is well suited to the study of these atoms. The single reference cavity of the Coherent 899-21 provides frequency stabilization for operation at linewidths of less than 500 kHz, and the system is available in either a Ti:Sapphire configuration (700 to 1000 nm tuning range) or a dye configuration (visible to over a micron tuning range) for extensive flexibility in the study of new atoms and optical trap experiments. The 899-21 ring laser is the only commercially available continuous wave (cw) system with a narrow linewidth single-frequency active stabilization feature.

A device using atomic transport to a ram may be constructed using laser trapping as described in U.S. Pat. No. 5,620,857 to Weetall, et al., issued Apr. 15, 1997, entitled "Optical trap for detection and quantitation of subzeptomolar quantities of analytes." This patent describes a device wherein tightly focused beams of laser light are used as "optical tweezers" to trap and manipulate polarizable objects such as microspheres of glass or latex with diameters on the order of 4.5 µm. Smaller objects may also be manipulated by this technique. This patent is incorporated by reference for purposes of describing optical traps and particle movement on the atomic level by radiant energy.

In certain aspects, the nanoparticle ram and reservoir may comprise a material selected from the group consisting of gold, chromium, tin, and indium. Indium is particularly advantageous in that it has very low vapor pressure at its melting point (157 degrees Centigrade).

The present invention further comprises a method of fabricating a nanoscale nanomotor. The steps comprise: (a) applying nanoparticles to a substrate to provide decorated substrates having at least one nanoparticle reservoir thereon; and (b) applying said decorated substrates and nanolevers to electrical connections. The method may also comprise the step of attaching the electrical connections to a voltage source having a reversible polarity. In this way, a device that has a shrinking and growing nanoparticle(s) and reciprocally moving nanolever(s) may be achieved. Part of the present manufacturing process may include the step of observing a nanolever in an electron microscope while attaching an electrode. The manufacturing may further include a process wherein the nanolever and the substrate are carbon nanotubes, which may be MWNTs formed simultaneously. The process of applying nanoparticles to a substrate may comprise thermal evaporation of a metal, and may further include evaporation of a thin layer of metal under vacuum. Furthermore, the present manufacturing method may include the step of attaching the nanolever to a mechanical switch that is operated in response to movement of the nanolever. For example, the nanolever may be arranged with another device so that its displacement away from the substrate caused it to contact another conductive member and complete a circuit.

In one preferred embodiment, one MWNT could be replaced by a substrate which is chemically treated to provide a particle track extending from the nanoparticle ram to the atom reservoir. This may be accomplished by surface treatment with materials that are philic for the atomic particles being moved and/or phobic for particles that are outside the desired track. Mechanical formation or etchants also can provide a track on a substrate. The substrate could therefore comprise a silicon wafer, or another form of nanostructure.

In another aspect, the present invention comprises a method of reciprocally moving a nanolever. Conceptually, the nanolever is attached by the nanoparticle ram to a substrate to which it relatively moves. The method of movement comprises providing a substrate having thereon a nanoparticle atom reservoir and nanoparticle ram, the nanoparticle ram further contacting a moveable nanolever; applying a voltage differential conducted along the nanolever between the atom reservoir and the nanoparticle ram such that atoms move from one to the other, causing a volumetric change in the nanoparticle ram as atoms move from one to the other; said volumetric change causing movement of a nanolever in one direction for expansion of the nanoparticle ram and in the opposite direction for contraction of the nanoparticle ram; and reversing voltage polarity to effectuate said reciprocal movement. To achieve movement, the substrate may be immobile and the nanolever move relative thereto, or vice versa. The nanolever is still is fixed at one end to for mechanical support and to permit an electrical contact. The voltage applied may be about one volt. The voltage path goes from nanolever to nanoparticle ram to substrate to atom reservoir.

Since the movement may involve both growth and shrinkage of a nanoparticle, the method may also comprise a process wherein the voltage polarity is reversed periodically in periods less than one minute. Depending on the size of the nanoparticle that is produced and the voltage control, the reciprocal movement may have a maximum stroke length between 50 and 150 nanometers. The ram may be attached to a switch which reverses polarity when the ram reaches certain minimum and maximum sizes, creating a feedback circuit with preset limits on ram movement.

In yet another alternative embodiment, the nanolever may be dispensed with entirely, and the device may be used for the creation of nanoparticles of a particular size at a given location. In this case, the particle begins to grow at a nucleation site at some point along the substrate. Movement is in one direction for a predetermined period of time, and the resultant crystal is grown until it reaches a predetermined size. In this embodiment, electrical connections on a substrate (e.g. MWNT) provide a voltage gradient between two nanocrystalline regions. These regions may be formed at areas of small defects on the nanotube substrate. If the voltage gradient is set in one polarity a nanocrystalline spot will grow as atoms (e.g. indium) move towards it (e.g. towards the positive electrode). In this embodiment, the indium or other materials have applications as optical or electrical switches, or even as harvestable nanocrystals, even in the absence of a mechanical arm attached to the crystal.

DETAILED DESCRIPTION OF THE PREFERRED EMBODIMENT

I. Generalized Method and Apparatus

Figure 1:
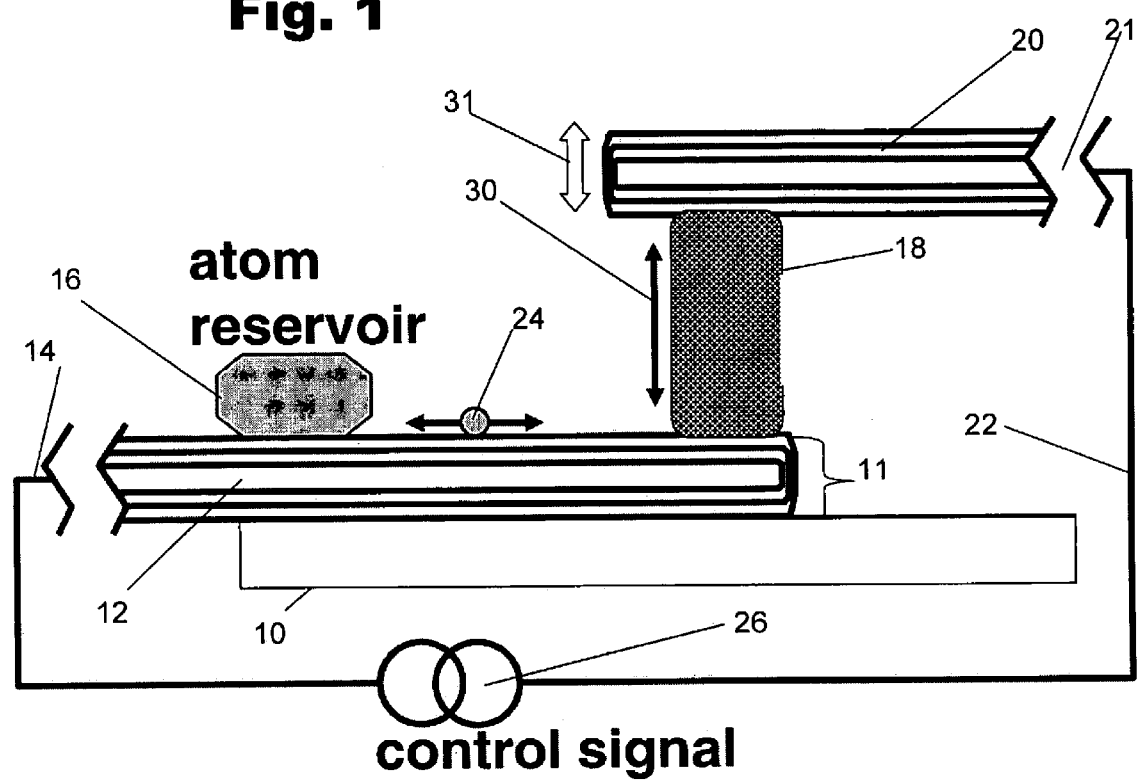
FIG. 1 is a diagrammatic view of the present nanomotor.

The present nanocrystal powered nanomotor provides a nanoscale linear motor, powered by a single metal nanocrystal ram sandwiched between mechanical lever arms. Low-level electrical voltages applied to the lever arms grow or shrink the nanocrystal, virtually atom-by-atom, in a controlled manner. The length of the ram is adjustable from zero to more than 150 nm, with extension speeds exceeding 1900 nm/s. This synthetic linear motor may find application in inorganic nanoelectromechanical systems (NEMS) devices as well as in hybrid synthetic/bio-motors and related structures.

Described below is the successful construction and operation of a synthetic and apparently wear-free cyclical nanoscale linear motor, powered by a single solid-state metal nanocrystal ram. The ram length and extension/retraction rates are precisely controlled via low-level dc voltage signals applied to mechanical lever arms contacting the ram. The entire motor may be composed of only two chemical species—one constituting the nanocrystal ram and its associated working matter storage reservoir, the other constituting the lever arms which couple the motor to its surroundings. Estimates for the maximum force capability and volumetric power density of the motor are extremely favorable.

The present metal nanocrystal ram is sandwiched between two mechanical lever arms formed from nanotubes, preferably multiwalled carbon nanotubes (MWNTs). Another metal nanocrystal, located on one of the lever arms near the ram, serves as the working matter reservoir. The two nanocrystals exchange matter, and therefore are of the same composition. One nanocrystal acts as an "atom reservoir" that sources metal atoms for ram extension and sinks (absorbs) metal atoms for ram contraction. Atom transfer between the reservoir and ram is controlled by an electrical current through the lever arms and the ram nanocrystal between them. The motor operates by growing and shrinking the nanocrystal ram, essentially atom-by-atom, to the required length. This design exploits the recent discovery of a nanoscale mass conveyor mechanism whereby electrical currents driven through nanotubes transport metal atoms on the nanotube surface (Ref. 10). Reversing the current direction reverses the direction of atom transport. Indium was used as the prototype nanocrystal material.

II. Definitions

Unless defined otherwise, all technical and scientific terms used herein have the same meaning as commonly understood by those in the field of nanotechnology/materials science. Although methods and materials similar or equivalent to those described herein can be used in the practice or testing of the present invention, the preferred methods and materials are described. For purposes of the present invention, the following terms are defined below.

"Nanoscale" means a size less than 1 μm (1000 nm).

"Substrate" means a relatively inert, rigid member used to support structures thereon or therein. Typical substrates would be silicon, glass, plastic, ceramic, etc. A substrate may be formed of carbon, which may be amorphous or in the form of a carbon nanotube, to which a nanolever is attached. The present substrate may physically and or chemically incorporate the atom reservoir referred to herein. That is, the atom reservoir does not need to be a compact or discrete particle, but may be comprised of diverse particles, even a gas, and may be included with the present substrate.

"Nanolever" means an atomically ordered, contiguous, self-supporting structure having an aspect ratio (length to width or diameter) between about 10 and 50. The preferred nanolever is 5 to 100 nm long. The preferred nanolever is a carbon nanotube, which means a single-walled nanotube, a multiwalled nanotube, a non-cylindrical nanotube, and mixtures of carbon and other atoms. The term nanolever may also encompass boron nitride, copper (See "Atomic-scale simulations of copper polyhedral nanorods," Kang et al. *Nanotechnology* 13 524-532 (2002)), and other materials. For $SiO_2$ materials, see Molecular Simulation 29 (10-11):671-676 (October-November 2003). Inorganic nanotubes or nanowires may also be employed. For example, Dragos Ciuparu and colleagues in Yale University's chemical engineering department describe the synthesis of pure, single-walled boron nanotubes (J. Phys. Chem B 2004, 108, 3967). See, also: Fan, R., Wu, Y., Li, Di. Yue, M., Majumdar, A. & Yang P., "Fabrication of silica nanotube arrays from vertical silicon nanowire templates," J. Am. Chem. Soc. 125, 5254-5255 (2003). In terms of the present apparatus, two components are caused to move together and apart; one component is termed, for simplicity, the substrate; the other is termed the nanolever. In practice, either or both components may be moveable.

"MWNT" means a carbon multiwalled nanotube. MWNTs have a near perfect carbon tubule structure that resembles a sheet of $sp^2$ bonded carbon atoms rolled into a seamless tube. They are generally produced by one of three techniques, namely electric arc discharge, laser ablation and chemical vapor deposition. The arc discharge technique involves the generation of an electric arc between two graphite electrodes, one of which is usually filled with a catalyst metal powder (e.g. iron, nickel, cobalt), in a Helium atmosphere. The laser ablation method uses a laser to evaporate a graphite target which is usually filled with a catalyst metal powder too. The arc discharge and laser ablation techniques tend to produce an ensemble of carbonaceous material which contains nanotubes (30-70%), amorphous carbon and carbon particles (usually closed-caged ones). The nanotubes must then be extracted by some form of purification process before being manipulated into place for specific applications. The chemical vapor deposition process utilizes nanoparticles of metal catalyst to react with a hydrocarbon gas at temperatures of 500-900° C. A variant of this is plasma enhanced chemical vapor deposition in which vertically aligned carbon nanotubes can easily be grown. In these chemical vapor deposition processes, the catalyst decomposes the hydrocarbon gas to produce carbon and hydrogen. The carbon dissolves into the particle and precipitates out from its circumference as the carbon nanotube. Thus, the catalyst acts as a 'template' from which the carbon nanotube is formed, and by controlling the catalyst size and reaction time, one can easily tailor the nanotube diameter and length respectively to suit. Carbon tubes, in contrast to a solid carbon filament, will tend to form when the catalyst particle is ~50 nm or less because if a filament of graphitic sheets were to form, it would contain an enormous percentage of 'edge' atoms in the structure. Alternatively, nanotubes may be prepared by catalytic pyrolysis of hydrocarbons as described by Endo, et al., in J. Phys. Chem. Solids, 54, 1841 (1993), or by Terroner, et al., in Nature, 388, 52 (1997) or by Kyotani, et al., in Chem. Mater., 8, 2190 (1996), the contents of all of which are incorporated by reference. Liquid nanoparticles useful in the present device include fluid metals such as indium or gold, and nanocrystalline solids in a liquid phase, such as described in Ge et al. "Evidence for Spinodal Phase Separation in Two-Dimensional Nanocrystal Self-Assembly," J. Phys. Chem. 104 (41): 9573-9575 (2000). Nanocrystals tend to be perfect, single crystals, so it is easily possible to grow a single crystal of indium at length scales of 0-150 nm. The final crystal is clearly far from the thermodynamic equilibrium shape suggested by the Wulff construction, implying a growth mode dominated by kinetics. Atoms only reach the engine nanocrystal through surface diffusion; gas phase transport is negligible because of indium's low vapor pressure. Thus the growth direction may be largely determined by the interfacial plane between the crystal and the nanotube. (By analogy with indium on graphite we expect this to be the {111} plane). For facets larger than a few tens of nanometers, the energy barriers for the nucleation of shape changes are large enough to prevent a nonequilibrium crystal from reverting spontaneously to a lower energy state. Thus there is little intrinsic limitation on the types of crystal morphologies (e.g. aspect ratios) that can be achieved with proper management of this type of directed surface transport.

"Nanocrystal" means an ultrafine particle (less than 1 μm) of a material arranged in a consistent pattern having a finite number of atoms and a lattice structure. The present nanocrystals are of chargable materials that move in response to an electric field. They are preferably metal. Metal nanocrystals are further defined in Kulkarni et al. "Mesoscale organization of metal nanocrystals," Pure Appl. Chem. 74(9):1581-1591 (2002). Preferred metals for use in the present device are: indium, gold, chromium, or tin. It is not necessary that the nanoparticles deposited on the substrate be in fact crystalline. They may be amorphous or even liquid, as long as they move on an atomic level, in response to an electrical force, with relative rapidity, and form a particle capable of doing mechanical work. Metals and crystal-forming materials are desirable in that they form rams with high aspect ratios compared to other forms of material.

"Nanoparticle" means a nanocrystal or other particle less than about 500 nm in diameter (if spherical) or 500 mm in any one direction that is composed of atoms that dissociate when charged. The nanoparticles herein may be solid or liquid and may be made of atoms of any chargeable material. A "chargeable" atom may be ferromagnetic, metallic, or a biological molecule capable of exhibiting charged behavior (e.g. migration though an electrophoretic gel). The property of being "chargeable" is exemplified by metals such as indium, thallium gallium, tin, titanium, lead, mercury, gold, silver, aluminum, platinum or copper, or alloys containing these metals. Organic molecules (including organic polymers) containing ionizable groups are also chargeable. The indium nanocrystal-powered motor is ideal for radiation-resistant, vacuum-compatible actuation, but with appropriate choice of materials this general process could be tailored for other practical applications. In this simplest nanomotor configuration the requisite heating and electric field are both derived from a single electrical supply, which supplies power in the microwatt range to the device. Nearly all of this power goes to heat, but if necessary the nanomotor's efficiency could be enhanced by using a ram material that was mobile at ambient temperatures. Crystal growth is known to occur in environments ranging from vacuum to in vivo. Bone growth, and other examples of crystals useful in the present device are found in: Brott, L. L. et al. "Ultrafast holographic nanopatterning of biocatalytically formed silica," Nature 413, 291-3 (2001); Aizenberg, J., Black, A. J. & Whitesides, G. M, "Control of crystal nucleation by patterned self-assembled monolayers," Nature 398, 495-498 (1999); Aizenberg, J., "Patterned crystallization of calcite in vivo and in vitro," Journal of Crystal Growth 211, 143-148 (2000); Whaley, S. R., English, D. S., Hu, E. L., Barbara, P. F. & Belcher, A. M., "Selection of peptides with semiconductor binding specificity for directed nanocrystal assembly,". Nature 405, 665-8 (2000); and Weiner, S., Traub, W. & Wagner, H. D., "Lamellar bone: structure-function relations," J Struct Biol 126, 241-55.

III. Assembled Device: FIG. 1

FIG. 1 is a simplified drawing showing the conceptual design of the assembled device. A substrate 10 has disposed thereon a multiwalled carbon nanotube (MWNT) 12, which utilizes the substrate as a mechanical support against movement by other components of the device. Optionally, the substrate 10 may be eliminated, and the movement leveraged against the MWNT 12 or other atomic track. In this case, the mechanical leverage is provided by a structure connected to a distal end of the MWNT 12, extending beyond the view of FIG. 1, as indicated at 11. One end of the MWNT 12 is connected to an electrical lead 14 that is brought into contact with the selected MWNT 12 with a nanomanipulator, as described in detail in connection with FIG. 3. Somewhere on the first MWNT 12, a metal particle 16, which serves as an "atom reservoir," is affixed to the MWNT. The atom reservoir 16 may or may not touch an external substrate 10, but is in contact with first MWNT 12 so that current from electrical lead 14, passing through first MWNT 12, acts upon the atom reservoir 16. The atom reservoir 16 may be on the nanolever. It may also be chemically or physically dispersed, so long as it is accessible to a source of an energy gradient (e.g. electrical, optical, magnetic or thermal) for delivery of atoms to and from the reservoir. The reservoir may be formed of atoms implanted into the substrate.

Closer to the end of the MWNT 12 that is opposite the electrical connection 14, a second metal particle 18, a "nanocrystal ram," is attached to the first MWNT 12. The nanocrystal ram 18 is termed a "ram" in that it acts analogously to a reciprocating ram or piston in a conventional motor. The nanocrystal ram 18 may be as far as about 500 nm from the atom reservoir 16, or may be directly opposite the atom reservoir, as illustrated in the electron micrograph of FIG. 2.

The nanocrystal ram 18 contacts both first MWNT 12 and a second MWNT 20 that was deposited on the substrate or prepared in such a way as to be in the vicinity of the nanocrystal ram 18. The second MWNT 20 is arranged so as to approach the first MWNT 12 in the absence of force exerted by the nanocrystal ram 18 inserted between the two MWNTs. The second MWNT 20 also has attached to it an electrical connection 22 that contacts a power supply 26 that produces a control signal and a circuit between connection 14, first MWNT 12, nanocrystal ram 18, second MWNT 20, and electrical connection 22. For purposes of illustration, a section line 21 is used to omit the entire length of MWNT 20, due to the extreme length-to-width ratios of these materials.

FIG. 1 further illustrates the operation of the present device. As shown at 24, atoms will move between the atom reservoir 16 and the nanocrystal ram 18 in response to current from the voltage source 26. The opposing arrows at atom particle 24 show that the atoms may move towards or away from the atom reservoir. This movement is controlled by a control signal from voltage source 24, and causes reciprocating movement of the nanocrystal ram 18 and, thereby, the lever arm MWNT 20. The control signal controls the polarity of the current in order to cause the bi-directional movement indicated by arrows 30 and at 24.

It should be noted that in certain embodiments, the electrical connections 14 and 21 and control signal may be varied. The connection 21 may be on the substrate. Furthermore, the voltage gradient across the substrate may be supplied without any electrical connections at all, or may be in fact a gradient supplied by magnetic or optical energy, as described above. IN this case, a laser would be directed at the atom reservoir and scanned across the substrate to and from the ram.

Figure 2:
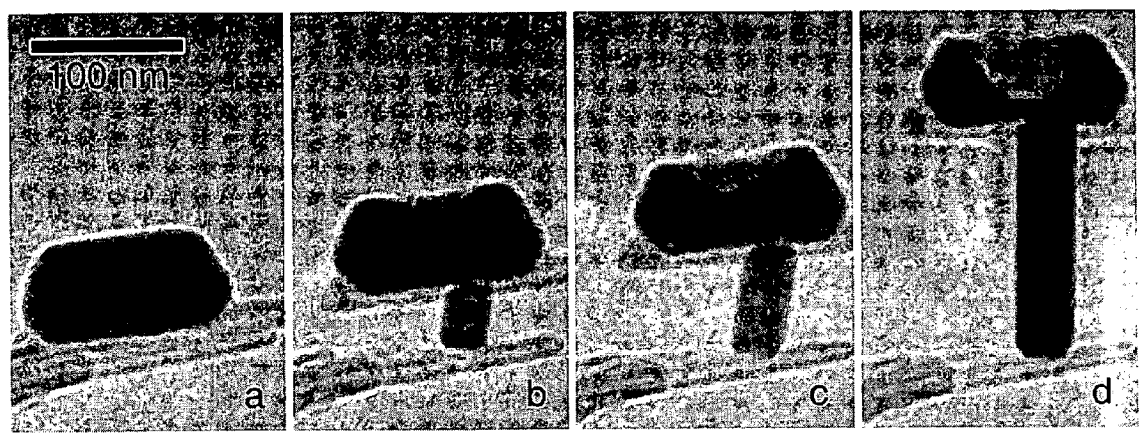
FIG. 2A-D is series of electron micrographs showing the present nanomotor in operation.

IV. Actual Device in Operation: FIG. 2

Operation of the completed device is relatively simple: using the MWNT lever arm (shown at 11 in FIG. 1) as a track for thermally-activated, electrically-directed indium surface diffusion (Ref 9), indium atoms from the atom reservoir are transported to the junction region where a single indium nanocrystal ram is grown directly between the lever arms. As the nanocrystal ram grows in length, it pushes the two MWNT lever arms apart. The ram growth rate and final length are fully controlled by the voltage applied to the lever arms. Importantly, the ram extension process is reversible allowing cyclical motor operation.

FIG. 2 consists of four panels representing a time series of TEM video images spanning 60 seconds. The nanocrystal ram grows from near zero displacement to extension of about 150 nm, as shown by the size bar. In panel (a), two MWNTs lie in contact with one another. A reservoir of indium atoms rests on the top nanotube. All of the metal nanocrystal atoms are in the atomic reservoir, which, in this case, is located on the movable MWNT, rather than the stationary MWNT, as in the embodiment of FIG. 1. The prominent dark indium nanocrystal visible on the upper MWNT lever arm is the atom reservoir.

Panel (b) shows that driving 2.1 µA through the circuit creates the nanocrystal ram, which begins to push the MWNTs apart. The material for the growing crystal comes from the atom reservoir, which now shows a small dip. In FIG. 2b the ram has grown sufficiently to separate the lever arms by approximately 32 nm.

As the ram grows in length, the cavity in the reservoir becomes more prominent (FIG. 2c). In panel (c), the nanocrystal ram has grown to ~75 nm long, and the dip in the atom reservoir is more prominent. Panel (d) shows that, at full extension the nanocrystal ram is more than 150 nm long, and the reservoir is nearly half depleted. The bright reflections to the lower right and upper left of the ram indicate that the ram consists of a single crystal domain.

A pre-determined ram length can be achieved by reducing the drive voltage to zero at any time, which immediately quenches atom transport and locks in the nanocrystal ram geometry. In yet another alternative embodiment, the present invention may be used simply for purposes of growing a nanocrystal at a predetermined point, using a low direct voltage to achieve an accurate, predetermined size. In this case, the nanocrystal is integrated into another structure. For example, it may be used for its optical properties, that is, a reflective mirror or lens, having optical properties that vary with the size of the nanocrystal. The crystal can be grown to a precise size using the mass transport mechanism described herein, and can be changed while in use to be larger or smaller, thereby changing the optical properties. The optical properties of the crystal can also be altered by heating the substrate, e.g. by applying a current through the electrodes. The crystal can also be harvested at a given size and used in other devices. A way of using such a nanocrystal grown according to the present method is described in Li et al. "Self-similar Chain of Metal Nanospheres as an Efficient Nanolens," Phys. Rev. Lett. 91(22): 227402-1-227402-227402-4 (November 2003).

The predetermined crystal length is useful in a number of applications wherein the "ram" is actually a crystal unconnected mechanically to other components. For example, if one can tune the size of a nanocrystal, one can: 1) tune the size of a quantum dot; 2) tune a mechanical resonance; 3) by adding this nanocrystal as a (tunable) impurity to an electrically conducting channel, one can tune the amount of electronic backscattering; 4) if semiconducting materials can be grown this way, their fluorescence properties can be tuned; and 5) tune the field focusing property mentioned above.

When the reservoir-containing lever arm is biased positively (i.e. when it constitutes the anode), the ram grows and the reservoir is depleted, as is shown in FIG. 2. Reversing the voltage drives indium in the opposite direction, causing the ram to contract and the reservoir to refill. The extension/retraction process is repeatable, allowing cyclical linear motor operation.

II. Construction of the Device

A. MWNTs

MWNTs were synthesized by the standard arc technique as described in Ebbesen et al. U.S. Pat. No. 5,641,466 issued Jun. 24, 1997, hereby incorporated by reference to describe a method for large-scale synthesis of carbon nanotubes. The technique that was used is also reported in the Nature publication of reference (11). In an inert gas at a pressure of 200-2500 torr, an arc discharge is made between two carbon rod electrodes by application of a suitable AC or DC voltage (e.g. about 18 V) to thereby produce a carbon plasma. The electric current is about 50-100 A. As the result a carbon deposit forms on the end of one of the two carbon rods, and a core part of the carbon deposit contains a large amount of carbon nanotubes. This core part can easily be separated from a shell part in which no carbon nanotubes exist. Usually carbon nanotubes occupy more than 65 wt % of the core part of the deposit, and the nanotubes coexist with some (less than 35 wt %) carbon nanoparticles which are nanometer-scale carbon particles with polyhedral cage structures. Sometimes a small amount of amorphous carbon also coexists.

B. Application of Nanoparticles

The nanotube-containing boule was next decorated with indium particles. The sample was lowered into a standard thermal evaporation device comprising a heated chamber that is placed under vacuum. The sample was suspended above a molybdenum "boat" containing indium. The vaporized indium condensed on nanotubes in the sample.

After the nanotube-containing sample was mounted in a thermal evaporator, the evaporation chamber was evacuated to a pressure of 2 microtorr or less. Indium metal of better than 99% purity was then thermally evaporated onto the sample. The amount of indium metal evaporated corresponded to a uniform thickness of 25 nm, as determined by an in situ crystal thickness monitor. However, because of the wetting properties of indium on MWNTs, the morphology of the indium film was that of discrete particles rather than a layer with continuous coverage.

Figure 3:
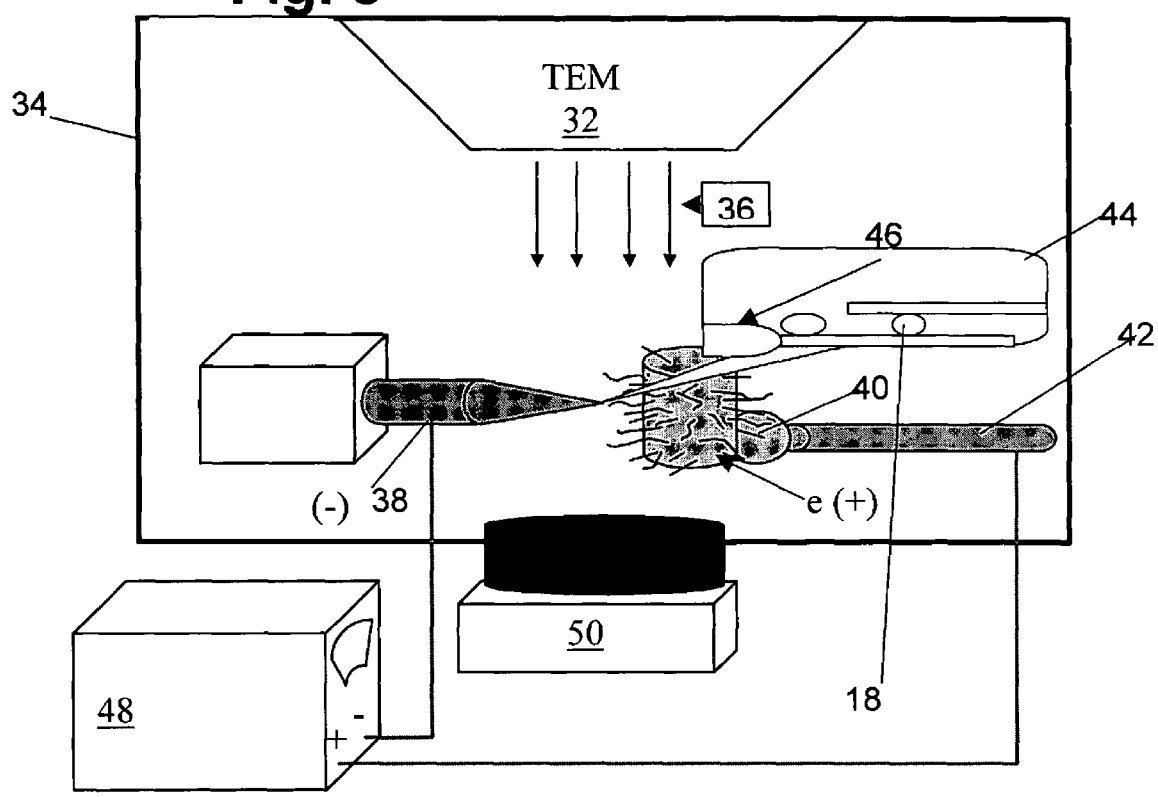
FIG. 3 is a diagrammatic view of apparatus for assembling and operating the present nanomotor.

C. Assembly: FIG. 3

A schematic diagram of a decorated nanotube manipulated upon a nanomanipulation stage is shown in FIG. 3, discussed below. The linear nanomotor was constructed and operated inside a high-resolution transmission electron microscope (TEM), specifically a JEOL FASTEM 2010 obtainable from JEOL USA, Peabody, Mass., with a custom-built nanomanipulation stage (described below). Raw materials for the nanomotor were first prepared ex-situ by decorating arc-grown MWNTs with indium nanoparticles via thermal evaporation. The decorated MWNTs were then mounted on the nanomanipulation stage and inserted into the TEM, where the motor configuration of FIG. 1 is created in situ. Using the nanomanipulator, two MWNT lever arms were placed in an overlapping parallel arrangement with care taken that an indium nanoparticle is present near the overlap junction to serve as the atom reservoir. By applying a voltage across the MWNT lever arm junction with external electronics, an electrical current is established through the lever arms and the junction.

The coated sample was then attached to a thin wire and fixed to the sample side of the TEM stage.

Referring now to FIG. 3, the sample is shown in an expanded view in insert 44. The sample is shown attached to Pt/Ir wire 42 (Platinum 90% Iridium 10% wire, 12 mil. diameter) through a small drop of silver paint 40. As can be seen in the expanded view, the first nanotube is adjacent to a second nanotube as described in connection with FIG. 1, with a nanocrystal ram 18 composed of the evaporated indium sandwiched between. The TEM 32 emits ~200 keV electrons as shown at 36. The wire 42 is attached to a standard sample holder in the stage area 34. A nanomanipulator 38 also was extended into the stage area 34. The nanomanipulator 38 is capable of nanoscale movements by virtue of electronically controlled piezoelectric crystals that deliver small vibrations to a moveable tip (shaded in FIG. 3). The nanomanipulator was obtained from Nanofactory Instruments AB, Wallerius-gatan 2, SE 412 58 Göteborg, Sweden. The tip can be manipulated forwards, backwards, up or down in tiny increments. It is viewed through the TEM 32 and positioned so that a freshly etched, fine tungsten tip is in contact with a selected nanotube that has an appropriate arrangement of metal particles and adjacent nanotube. The tip and the sample are connected to a controllable voltage source 48. The manipulations can be recorded on a CCD camera 50 that records the TEM images.

III. Operation and Characterization

Figure 4:
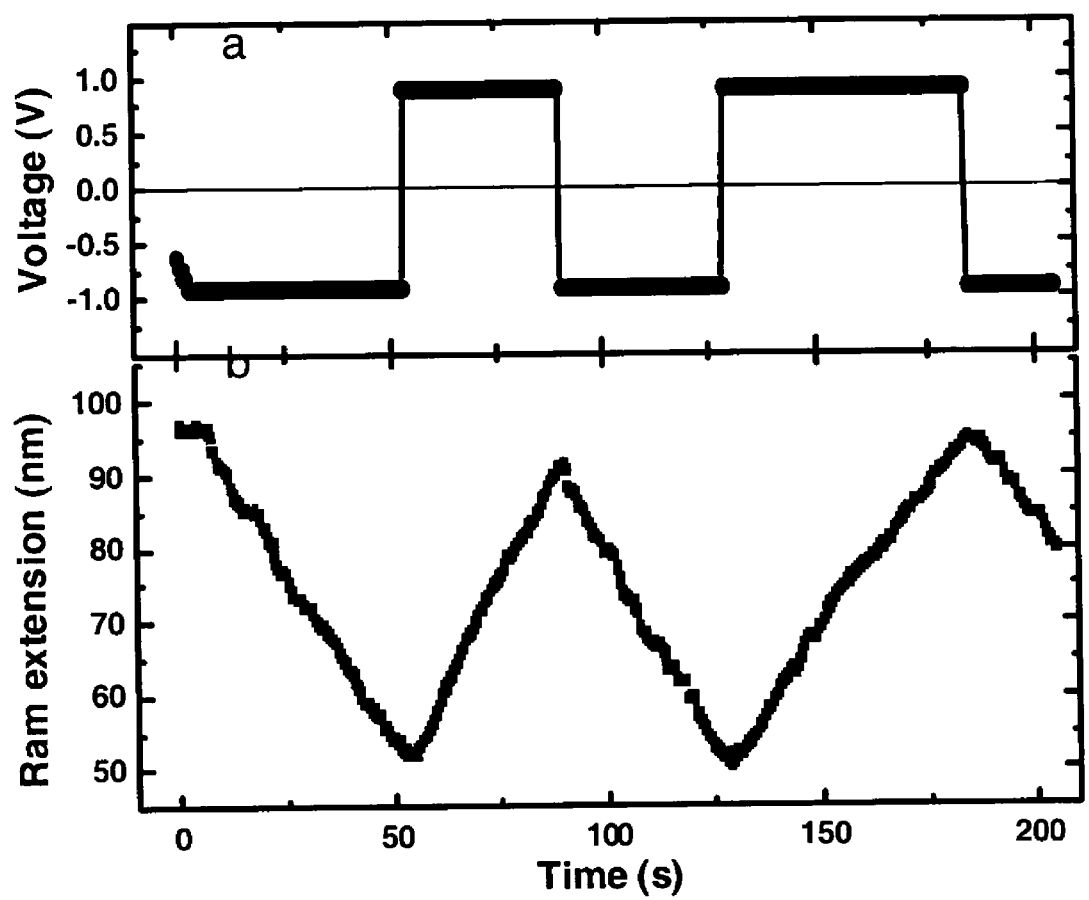
FIG. 4 is a graph showing applied voltages and movement of the motor ram in response thereto.

A. Operation of the Nanomotor: FIG. 4

FIG. 4 shows, for a different nanomotor of virtually identical design, details of cyclical operation of the nanomotor. As the control voltage (upper panel a) is sequentially switched between +0.9V and −0.9V, the ram 18 grows in length (and width) and shrinks linearly with time, as shown in the lower panel b of FIG. 4. The nanomotor is seen here to cycle regularly with a stroke of ~45 nm and a speed of ~1 nm/s. Increasing (decreasing) the drive voltage increases (decreases) this rate. At low drive voltages the (thermally activated) atom transport dramatically slows as Joule-heating is reduced. The drive voltage upper limit, and hence maximum speed, is fixed by the requirement that the nanocrystal remain below its melting point. Even after repeated motor cycling, the reservoir is replenished at the end of each contraction cycle, indicating that indium loss mechanisms, such as evaporation or diffusion off the MWNT lever arms, are negligible during normal motor operation.

B. Characterization of the Nanomotor

The nanocrystal motor has important qualitative advantages over other small scale, synthetic actuators. It does not suffer the friction problems of microelectromechanical mechanisms such as comb drives, nor does it have an inherently tiny stroke like deformable structures made of piezoelectric or bimorph materials. This design is a model of spatial efficiency, effectively incorporating typical (macroscopic) linear motor components of piston, cylinder, and valves into a single homogeneous nanocrystal. Excepting the atom reservoir, whose volume is dictated only by the intended application of the motor, the largest spatial dimension of the motor is equal to the nanocrystal ram stroke. Relative to piezoelectric and electrostatic actuators, our nanomotor also operates at very low voltage. Furthermore, its intrinsic "set and forget" feature, which allows the motor to maintain a given displacement indefinitely with zero power consumption, may be advantageous in some applications.

A complete thermodynamic description of the nanocrystal growth process must account for the flow of heat, mass, and charge. The well-studied phenomenon of frost heaving provides a surprisingly close analogy. Contrary to the naïve expectation, frost heaving, or the upward growth of ice crystals in porous soils, is not driven by the volume expansion of water upon freezing (Ref. 10). Rather, unfrozen water, stabilized below the bulk freezing temperature by curvature, surface, or solute effects, is drawn towards the freezing front by a gradient in the chemical potential (Ref. 11). The resulting pressures can do work against, e.g., a gravitational potential, even as heat is removed from the system (Ref. 12). In the simplest geometries, the maximum crystallization pressure $P_{max}$ is given by $P_{max}=\rho L(T_m-T)/T_m$, where $\rho$ is the density of ice, L is the enthalpy of fusion, T is the temperature of the fluid at the freezing front and $T_m$ is the bulk freezing temperature (Ref. 13).

In the case presented here, indium is driven towards the growth site by an electric field-induced chemical potential gradient. Without wishing to be bound to any scientific theory, the inventors propose that premelting at the nanotube/indium crystal interface drives the growth of the indium crystal against the applied mechanical pressure, in the same way that interfacial premelting drives frost heave (Ref. 11). Surface melting on indium microcrystals has been observed as much as 360 K below the bulk melting temperature (Ref. 14), and interaction with the graphene surface of the nanotube may further lower the premelting onset temperature (Refs. 15-17).

The frost heave analogy allows the examination of the available force and volumetric power density of the nanocrystal ram motor. Taking L equal to the latent heat of fusion of liquid indium (0.034 eV/atom (Ref. 18), and the reduced temperature $(T_m-T)/T_m=10^{-2}$, gives an available ram pressure of $P_{max}=20$ bar. Assuming a ram cross-sectional area of $(36 \text{ nm})^2$, the associated force $F_r=2.6$ nN. This may be a lower limit, as both the electrostatic pressure imparted to the indium atoms by the control voltage and the adsorbed gas-to-liquid condensation energy favor ram growth. (Of course the strength of the ram, although likely much greater than that of bulk, polycrystalline indium, imposes an independent limit on its force capabilities). As a check, we calculate the force needed to pry the MWNT lever arms apart in the configuration of FIG. 2. Modeling the lever arms as cantilevered beams, the standard Euler-Bernoulli beam deflection expression (Ref. 19), $F=3 \text{ EId}/l^3$ relates the transverse force F applied to the free end of the beam to the beam's Young's modulus E, cross-sectional areal moment of inertia about its central axis $I=\pi(r_{outer}^4-r_{inner}^4)/4$, displacement from equilibrium d, and length l. With $E \approx 1$ TPa (Ref. 20), $r_{outer}=16$ nm, $r_{inner}=6$ nm, $l=3$ μm, and $d=140$ nm, we find $F \approx 1$ nN, within the available motor force capability determined above (possible electrostatic forces between the lever arms are substantially smaller). Linear nanoscale biomotors are much less forceful, typically operating in the piconewton range (Ref. 6).

In terms of volumetric power density, the nanocrystal ram compares favorably with competing motor technologies. We have observed nanocrystal ram extension velocities in excess of 1900 nm/sec, where the measurement was limited by the TEM video update rate of 30 frames per second. This velocity, together with the ram force $F_r$, implies a motor power output capability of 5 fW. The available power density $\Pi_a$ varies inversely with ram extension. For the motor shown in FIG. 2, $\Pi_a$ is initially (assuming a single monolayer nanocrystal) ~8 GW/m$^3$ and decreases to 20 MW/m$^3$ at ram full extension. In comparison, typical biomotors (Refs. 6, 21, 22) achieve power densities of less than 30 MW/m$^3$, while the power density of a refined macroscopic linear internal combustion engine is around 50 MW/m$^3$ (calculated for a 2004 Toyota Camry 210 hp V6, where the 3 liter displacement has been taken as the working volume). The power density comparison with biomotors is somewhat surprising, given that the chemical reactions driving biomotors are typically an order of magnitude larger than the per-atom latent heat of fusion of indium; this again highlights the spatial efficiency of our nanocrystal motor. If macroscopic force output is desired, these nanoscale linear motors could be ganged, as in the case where molecular biomotors combine to form muscle tissue.

From a thermodynamic standpoint our linear nanocrystal-powered motor is unusual, in that it does work while converting the working fluid to the low energy phase. In contrast, the steam engine, for example, drives an energetically expensive phase transition and then extracts work from the resulting gas. In the nanocrystal nanomotor case the phase transition is exothermic and drives the actuator directly. The precise, responsive control afforded by electrically-directed atomic transport harnesses these typically high energy densities to drive a compact, powerful motor.

C. Applications

The present nanotube based reciprocating motors have obvious MEMS/NEMS applications. The reciprocating nanotube could also serve as a gate for controlling or inducing fluid motion in microfluidics systems, or as a mechanical switch. The use of a silicon chip as a substrate would permit the etching of various channels for microfluidics, as well as the layering of different structures for translating ram and lever movement into higher order machines. The present device could be used to control the deposition of nanotubes onto a substrate or metal onto a nanotube, when coupled with a nanomanipulator. The moving nanotube could itself be part of a microscopic tip, or it could be used to control reactions by being inserted into a microfluidic channel or vessel. This might require the further deposition of a biological or chemical species onto the moving nanolever. The present device may be constructed with one nanolever essentially immoveable, and the ram driving a second nanolever. Alternatively, both nanolevers may be moveable, with growth of the ram serving to displace both nanolevers. In addition, the nanoparticles may be composed of alloys or mixed materials so as to impart different movement properties over a given cycle of ram expansion and contraction.

The present device also can be used to grow crystals of variable size. By making these crystals larger and smaller, optical and other electromagnetic modulations of an incident beam would be accomplished. The present examples disclose the fabrication of rams composed of indium and cobalt, but beyond metals there is a wide class of materials known to electrocystallize, including calcium carbonate and organic conductors. For coupling the motor to a surrounding mechanism, carbon nanotubes may be preferred even in other applications, as they are chemically inert, high-aspect ratio, and the stiffest known material. High frequency applications (1 MHz to 10 GHz) may be obtained by rapidly reversing polarity of control signal 26 and altering oscillation of nanolever 20.

While the foregoing device and its method of construction and operation has been described in reference to particular embodiments actually constructed, many variations and embellishments are possible in view of the above teachings. Therefore, it is intended that the present invention not be limited to the specific embodiments described above, but rather to the scope of the appended claims.

REFERENCES

1. M. S. Fuhrer et al., *Science* 288, 494-497 (2000).
2. D. Hisamoto et al., *Ieee Transactions on Electron Devices* 47, 2320-2325 (2000).
3. J. W. Judy, *Smart Materials & Structures* 10, 1115-1134 (2001).
4. J. Howard, *Nature* 389, 561-567 (1997).
5. R. D. Vale, R. A. Milligan, *Science* 288, 88-95 (2000).
6. K. Visscher, M. J. Schnitzer, S. M. Block, *Nature* 400, 184-189 (1999).
7. R. D. Vale, *Journal of Cell Biology* 163, 445-450 (2003).
8. S. Karki, E. L. F. Holzbaur, *Current Opinion in Cell Biology* 11, 45-53 (1999).
9. B. C. Regan, S. Aloni, R. O. Ritchie, U. Dahmen, A. Zettl, *Nature* in press (2004).
10. S. Taber, *Journal of Geology* 37, 428-461 (1929).
11. A. W. Rempel, J. S. Wettlaufer, M. G. Worster, *Journal of Fluid Mechanics* 498, 227-244 (2004).
12. H. Ozawa, *Physical Review E* 56, 2811-2816 (1997).
13. B. V. Derjaguin, N. V. Churaev, *Journal of Colloid and Interface Science* 67, 391-396 (1978).

14. A. Pavlovska, D. Dobrev, E. Bauer, *Surface Science* 314, 341-352 (1994).
15. J. G. Dash, *Science* 246, 1591-1593 (1989).
16. L. A. Wilen, J. S. Wettlaufer, M. Elbaum, M. Schick, *Physical Review B* 52, 12426-12433 (1995).
17. L. A. Wilen, J. G. Dash, *Physical Review Letters* 74, 5076-5079 (1995).
18. D. R. Lide, *CRC Handbook of Chemistry and Physics* (CRC Press, Boca Raton, Fla., ed. Electronic, 2000).
19. R. S. Ruoff, D. C. Lorents, *Carbon* 33, 925-30 (1995).
20. P. Poncharal, Z. L. Wang, D. Ugarte, W. A. De Heer, *Science* 283, 1513-16 (1999).
21. R. K. Soong et al., *Science* 290, 1555-8 (2000).
22. L. Limberis, R. J. Stewart, *Nanotechnology* 11, 47-51 (2000).
23. B. Habeebullah, G. M. Zaki, M. Akyurt, *Energy Conversion and Management* 44, 251-265 (2003).

What is claimed is:

1. A nanoscale motor, comprising:
   an atom reservoir operable to provide atoms;
   a nanoparticle ram coupled to the atom reservoir and operable to receive the atoms from the atom reservoir;
   a substrate coupling the atom reservoir to the nanoparticle ram;
   a nanolever coupled to the nanoparticle ram, the nanolever operable to move in response to the nanoparticle ram receiving the atoms from the atom reservoir; and
   a voltage source electrically coupled to the substrate and operable to deliver reversible positive and negative voltages to electrical connections of the motor, the reversible positive and negative voltages operable to cause reciprocal movement of the nanolever.

2. The nanoscale motor of claim 1 wherein the substrate and nanolever are selected from the group consisting of multiwalled carbon nanotubes, single walled carbon nanotubes, silicon and silicon oxide.

3. The nanoscale motor of claim 1 wherein the nanoparticle ram and the atom reservoir comprise a metal.

4. The nanoscale motor of claim 1 wherein the nanoparticle ram and the atom reservoir both are comprised of a material selected from the group consisting of gold, chromium, tin, and indium.

5. The nanoscale motor of claim 4 wherein the nanoparticle ram is comprised of indium.

6. The nanoscale motor of claim 1 wherein the nanoparticle ram is a solid nanocrystal.

7. The nanoscale motor of claim 1 further comprising a source of radiant energy differential coupled to the substrate, the source of radiant energy differential operable to conduct the radiant energy differential across the atom reservoir and the nanoparticle ram.

8. The nanoscale motor of claim 7 wherein the source of radiant energy differential is selected from the group consisting of:
   a voltage source for a voltage differential; a laser for an optical differential;
   and a magnet for a magnetic differential.

9. The nanoscale motor of claim 1 wherein the nanoparticle ram comprises indium, thallium gallium, tin, titanium, lead, mercury, gold, silver, aluminum, platinum or copper, or alloys containing these metals.

10. A nanoscale motor, comprising:
    a substrate;
    first and second electrodes coupled to the substrate;
    an atom reservoir coupled to the substrate approximately between the first and second electrode;
    a nanoparticle ram coupled to the substrate approximately between the atom reservoir and the second electrode; and
    a nanolever coupled to the nanoparticle ram;
    wherein the first and second electrodes are operable to receive an applied voltage, the atom reservoir is operable to provide atoms in response to the applied voltage, and the nanoparticle ram is operable to receive the atoms and in response to cause the nanolever to move.

11. The nanoscale motor of claim 10 wherein the first and second electrodes are operable to receive a second applied voltage, the nanoparticle ram is operable to provide second atoms in response to the second applied voltage and in response to cause the nanolever to move, and the atom reservoir is operable to receive the second atoms.

* * * * *